(12) United States Patent
Wu

(10) Patent No.: US 8,995,572 B1
(45) Date of Patent: *Mar. 31, 2015

(54) DIGITAL PREDISTORTION FOR NONLINEAR RF POWER AMPLIFIERS

(71) Applicant: Marvell International Ltd., Hamilton (BM)

(72) Inventor: Songping Wu, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/216,646

(22) Filed: Mar. 17, 2014

Related U.S. Application Data

(63) Continuation of application No. 13/087,287, filed on Apr. 14, 2011, now Pat. No. 8,699,620.

(60) Provisional application No. 61/325,207, filed on Apr. 16, 2010.

(51) Int. Cl.
*H04K 1/02* (2006.01)

(52) U.S. Cl.
CPC ..................................... *H04B 7/714* (2013.01)
USPC ............ 375/297; 375/296; 375/254; 375/324

(58) Field of Classification Search
USPC .................................. 375/297, 296, 324, 254
See application file for complete search history.

(56) References Cited

U.S. PATENT DOCUMENTS

| | | | |
|---|---|---|---|
| 4,291,277 | A | 9/1981 | Davis et al. |
| 4,967,164 | A | 10/1990 | Sari |

(Continued)

FOREIGN PATENT DOCUMENTS

| | | |
|---|---|---|
| EP | 380167 | 8/1994 |
| EP | 387948 | 8/1994 |

(Continued)

OTHER PUBLICATIONS

"Draft Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band", IEEE 802.11g, 2003, 69 pages.

(Continued)

*Primary Examiner* — Kabir A Timory

(57) ABSTRACT

Systems and techniques relating to wireless communications are described. A described technique includes aligning a received data sequence with a transmitted data sequence to produce an aligned data sequence, the received data sequence being based on an output of a power amplifier having one or more nonlinear characteristics that is responsive to the transmitted data sequence; dividing the aligned data sequence into N segments; obtaining first nonlinear parameters for the power amplifier based at least on first segments of the N segments; obtaining a second nonlinear parameter(s) corresponding to a second segment(s) of the N segments based on an extrapolation of the first nonlinear parameters, the second segment(s) having a lower transmitted data sequence value(s) than the first segments; and performing digital predistortion on a transmit data sequence based on the nonlinear predistortion parameters to compensate for the one or more nonlinear characteristics of the power amplifier.

24 Claims, 8 Drawing Sheets

(56) References Cited

U.S. PATENT DOCUMENTS

| | | | |
|---|---|---|---|
| 5,049,832 | A | 9/1991 | Cavers |
| 5,107,520 | A | 4/1992 | Karam et al. |
| 5,148,448 | A | 9/1992 | Karam et al. |
| 5,253,272 | A | 10/1993 | Jaeger et al. |
| 5,486,789 | A | 1/1996 | Palandech et al. |
| 5,760,646 | A | 6/1998 | Belcher et al. |
| 5,892,397 | A | 4/1999 | Belcher et al. |
| 5,905,760 | A | 5/1999 | Schnabl et al. |
| 5,910,965 | A | 6/1999 | Ierfino et al. |
| 5,929,703 | A | 7/1999 | Sehier et al. |
| 5,949,283 | A | 9/1999 | Proctor et al. |
| 5,959,499 | A | 9/1999 | Khan |
| 6,072,364 | A | 6/2000 | Jeckelin et al. |
| 6,075,411 | A | 6/2000 | Briffa et al. |
| 6,078,216 | A | 6/2000 | Proctor |
| 6,108,385 | A | 8/2000 | Worley |
| 6,118,335 | A | 9/2000 | Nielsen et al. |
| 6,194,964 | B1 | 2/2001 | Jun |
| 6,236,837 | B1 | 5/2001 | Midya |
| 6,240,144 | B1 | 5/2001 | Ha |
| 6,240,278 | B1 | 5/2001 | Midya et al. |
| 6,252,912 | B1 | 6/2001 | Salinger |
| 6,275,685 | B1 | 8/2001 | Wessel et al. |
| 6,288,610 | B1 | 9/2001 | Miyashita |
| RE37,407 | E | 10/2001 | Eisenberg et al. |
| 6,298,096 | B1 | 10/2001 | Burgin |
| 6,298,097 | B1 | 10/2001 | Shalom |
| 6,320,463 | B1 | 11/2001 | Leva et al. |
| 6,587,514 | B1 * | 7/2003 | Wright et al. ................. 375/296 |
| 6,836,517 | B2 | 12/2004 | Nagatani et al. |
| 6,928,122 | B2 | 8/2005 | Opas |
| 6,963,242 | B2 | 11/2005 | White et al. |
| 6,985,704 | B2 | 1/2006 | Yang et al. |
| 7,058,369 | B1 | 6/2006 | Wright et al. |
| 7,071,777 | B2 | 7/2006 | McBeath et al. |
| 7,085,330 | B1 | 8/2006 | Shirali |
| 7,102,430 | B2 | 9/2006 | Johnson et al. |
| 7,184,490 | B1 | 2/2007 | Rybicki et al. |
| 7,203,247 | B2 | 4/2007 | Bauder |
| 7,289,575 | B1 | 10/2007 | Kenington |
| 7,313,199 | B2 | 12/2007 | Gupta et al. |
| 7,362,821 | B1 | 4/2008 | Shirali |
| 7,535,974 | B1 | 5/2009 | Shirali |
| 8,326,239 | B1 | 12/2012 | Peiris |
| 8,340,602 | B1 | 12/2012 | Peiris |
| 2001/0004223 | A1 | 6/2001 | Kim |
| 2002/0065048 | A1 | 5/2002 | Nagatani |
| 2008/0139141 | A1 | 6/2008 | Varghese et al. |

FOREIGN PATENT DOCUMENTS

| | | |
|---|---|---|
| WO | 9804034 | 1/1998 |
| WO | 9828888 | 7/1998 |
| WO | 0001065 | 1/2000 |
| WO | 0215389 | 2/2002 |

OTHER PUBLICATIONS

Andreani, P., et al., Chip for Wideband Digital Predistortion RF Power Amplifier Linearization, Electronics Letters, May 22, 1997, pp. 925-926, vol. 33, No. 11, IEEE, 2 pages.

ANSI/IEEE, Std. 802.11, 1999 Edition, Part 11: Wireless LAN Medium Access Control (MAC) and Physical Layer (pHY) Specifications, Aug. 20, 1999, IEEE, 531 pages.

Cavers, James K., The Effect of Quadrature Modulator and Demodulator Errors on Adaptive Digital Predistorters for Amplifier Linearization, IEEE Transactions on Vehicular Technology, May 1997, pp. 456-466, vol. 46, No. 2, IEEE, 11 pages.

D'Andrea, Aldo N., et al. A Digital Approach to Efficient RF Power Amplifier Linearization, Proc. of IEEE Globe COLMN '97,1997, pp. 77-81, IEEE, 3 pages.

Faulkner, Michael, et al., Adaptive Linearization Using Predistortion—Experimental Results, IEEE Transactions on Vehicular Technology, May 1994, pp. 323-332, vol. 43, No. 2, IEEE, 10 pages.

IEEE Std 802.11 b-1999 (Supplement to IEEE Std 802.11—1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.11a—1999 (Supplement to IEEE Std 802.11—1999) [Adopted by ISOIIEC and redesignated as ISOIIEC 8802-11: 1999/ Amd 1 :2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

Information technology—Telecommunications and information exchange between systems—Local and metropolitan networks—specific requirements. Part 11: Wireless LAN Medium Access Control (MAC) and Physical Layer (PHY) Specifications, IEEE Std. 802.11n, Oct. 29, 2009, 535 pages.

Johnson, Daniel Eric, Adaptive Digital Predistortion with Applications for LMDS Systems, Aug. 25, 2000, Virginia Polytechnic Institute and State University, US, 98 pages.

Qian et al., "Digital Predistortion for Nonlinear RF Power Amplifiers," U.S Appl. No. 12/860,108, filed Aug. 20, 2010, to be published by the USPTO, 36 pages.

Sundstrom, Lars, et al., Effects of Reconstruction Filters in Digital Predistortion Linearizers for RF Power Amplifiers, IEEE Transactions on Vehicular Technology, Feb. 1995, pp. 131-139, vol. 44, No. 1, IEEE US, 9 pages.

Sundstrom, Lars, et al., Quantization Analysis and Design of a Digital Predistortion Linearizer for RF Power Amplifiers, IEEE Transactions on Vehicular Technology, Nov. 1996, pp. 707-719, vol. 45, No. 4, IEEE, 13 pages.

Zavosh, Frank, et al., Digital Predistortion Techniques for RF Power Amplifiers with CDMA Applications, Microwave Journal, Oct. 1999, Horizon House Publications, 9 pages.

* cited by examiner

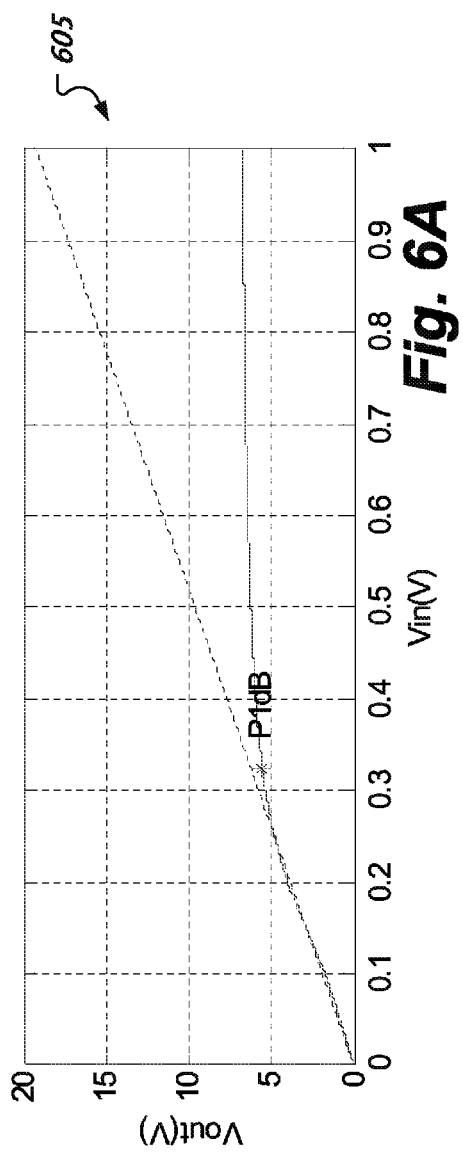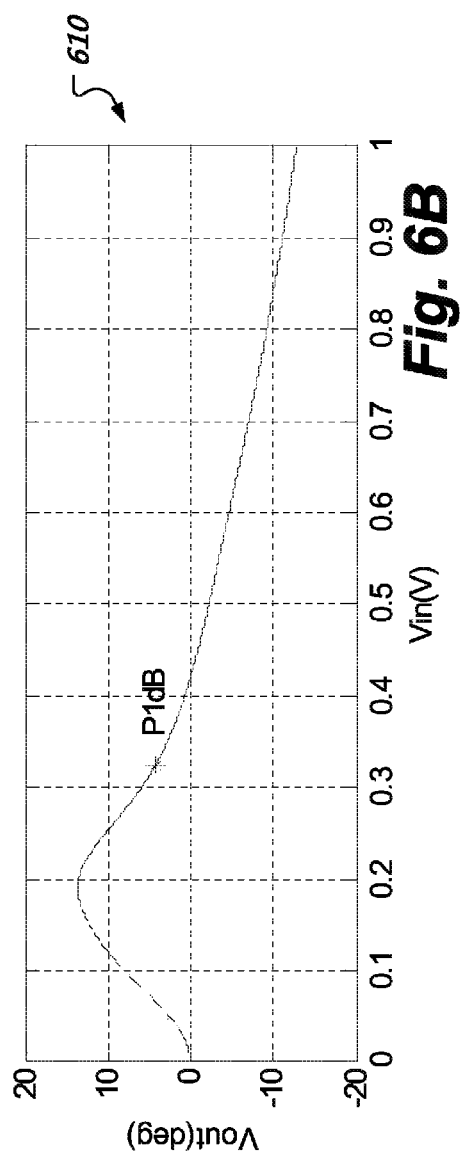

DIGITAL PREDISTORTION FOR NONLINEAR RF POWER AMPLIFIERS

CROSS REFERENCE TO RELATED APPLICATION

This disclosure is a continuation of and claims the benefit of priority of U.S. patent application Ser. No. 13/087,287, filed Apr. 14, 2011 and entitled "Digital Predistortion For Nonlinear RF Power Amplifiers" (now U.S. Pat. No. 8,699,620), which claims the benefit of the priority of U.S. Provisional Application Ser. No. 61/325,207, filed Apr. 16, 2010 and entitled "A New Digital Predistortion Scheme to Linearize PA," which is incorporated herein by reference in its entirety.

BACKGROUND

This disclosure relates to wireless communications.

Wireless communication devices typically use power amplifiers to amplify signals prior to over the air transmission. The efficiency of a power amplifier generally impacts the performance of devices such as a mobile phone or a base station. For a mobile phone, a higher efficiency power amplifier can increase battery life. For a base station, a higher efficiency power amplifier can reduce power consumption, which results in lower operating costs. However, high efficiency power amplifiers are typically nonlinear in power output response. Nonlinear amplification may cause spectral regrowth (e.g., a transmission mask violation) and in-band distortion (e.g., error vector magnitude (EVM) degradation). Wireless communication devices can perform power amplifier linearization to cancel nonlinear characteristics of a power amplifier. Various examples of linearization include feedback, feedforward, and predistortion techniques. Digital predistortion techniques can include polynomial based method and look-up table based methods.

Wireless communication devices can use one or more wireless communication technologies such as orthogonal frequency division multiplexing (OFDM). In an OFDM based wireless communication system, a data stream is split into multiple data substreams. Such data substreams are sent over different OFDM subcarriers, which can be referred to as tones or frequency tones. Wireless communication devices can communicate based on one or more wireless standards such as Worldwide Interoperability for Microwave Access (WiMAX), Bluetooth, or wireless local area network (WLAN) standards such as IEEE 802.11 standards. Various examples of wireless communication devices include mobile phones, smart phones, wireless routers, wireless hubs, base stations, and access points. In some cases, wireless communication electronics are integrated with data processing equipment, such as laptops, personal digital assistants, and computers

SUMMARY

The present disclosure includes systems and techniques related to wireless communications.

According to an aspect of the described systems and techniques, a method for wireless communications includes generating a digital transmit signal; receiving a digital receive signal that is based on an amplified analog version of the digital transmit signal, where the amplified analog version is produced by a power amplifier having one or more nonlinear characteristics; storing signal samples, the signal samples including transmit samples based on the digital transmit signal and receive samples based on the digital receive signal determining gain coefficients based on at least a portion of the signal samples, the gain coefficients being associated with respective first operational ranges of the power amplifier; determining predistortion values, and using the predistortion values to predistort digital signals to compensate for the one or more nonlinear characteristics of the power amplifier. The predistortion values can include first values based on the gain coefficients, the first values being associated with the first operational ranges, and one or more second values based on an extrapolation of at least two of the gain coefficients, the one or more second values being associated with respective one or more second operational ranges of the power amplifier.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, one or more disclosed embodiments can be implemented in various systems and apparatus, including, but not limited to, a special purpose data processing apparatus (e.g., a wireless communication device such as a wireless access point, a remote environment monitor, a router, a switch, a computer system component, a medium access unit), a mobile data processing apparatus (e.g., a wireless client, a cellular telephone, a smart phone, a personal digital assistant (PDA), a mobile computer, a digital camera), a general purpose data processing apparatus such as a computer, or combinations of these.

A device for wireless communications can include circuitry configured to produce a digital transmit signal and receive a digital receive signal; and a memory to store signal samples, the signal samples including transmit samples based on the digital transmit signal and receive samples based on the digital receive signal. The circuitry can be configured to perform operations comprising determining gain coefficients based on at least a portion of the signal samples, the gain coefficients being associated with respective first operational ranges of the power amplifier; determining predistortion values, the predistortion values including first values based on the gain coefficients, the first values being associated with the first operational ranges, and one or more second values based on an extrapolation of at least two of the gain coefficients, the one or more second values being associated with respective one or more second operational ranges of the power amplifier; and using the predistortion values to predistort digital signals to compensate for the one or more nonlinear characteristics of the power amplifier.

A system for wireless communications can include processor electronics configured to produce a digital transmit signal; a first converter to convert the digital transmit signal to an analog transmit signal; a power amplifier to amplify the analog transmit signal, wherein the power amplifier has one or more nonlinear characteristics; receiver circuitry to receive an analog receive signal; and a second converter to convert the analog receive signal to a digital receive signal. The processor electronics can be configured to perform operations that include causing the receiver circuitry to receive the amplified analog transmit signal as the analog receive signal, storing signal samples, the signal samples including transmit samples based on the digital transmit signal and receive samples based on the digital receive signal; determining gain coefficients based on at least a portion of the signal samples, the gain coefficients being associated with respective first operational ranges of the power amplifier; determining predistortion values, the predistortion values including first values based on the gain coefficients, the first values being associated with the first operational ranges, and one or more second values based on an extrapolation of at least two of the gain coefficients, the one or more second values being associated with respective one or more second operational ranges of the power amplifier; and using the predistortion values to predistort digital signals to compensate for the one or more nonlinear characteristics of the power amplifier.

Details of one or more implementations are set forth in the accompanying drawings and the description below. Other features and advantages may be apparent from the description and drawings, and from the claims.

DRAWING DESCRIPTIONS

FIGS. 6A and 6B show examples of nonlinear characteristics of a power amplifier.

Like reference symbols in the various drawings indicate like elements.

DETAILED DESCRIPTION

This disclosure provides details and examples of technologies for wireless communications, including digital predistortion techniques for nonlinear power amplifiers. One or more the techniques described herein can use values stored in a look-up table to digitally predistort signals before signal amplification. The look-up table can store predistortion values that correspond to different operational ranges of a power amplifier. This disclosure includes techniques that increase look-up table based estimation accuracy for low amplitude operational ranges, which are typically characterized by low signal-to-noise-ratios (SNRs).

In various communication devices, a transmit data path and a receive data path are both present because these devices communicate with other devices by transmitting and receiving signals. As disclosed herein, digital predistortion techniques can use such receive data paths for looping back amplified transmission signals to estimate predistortion values that are used to cancel nonlinear characteristics introduced by signal amplification. A digital predistortion technique can be adaptive to changes of the nonlinear characteristics during operation of a wireless communication device.

Figure 1:
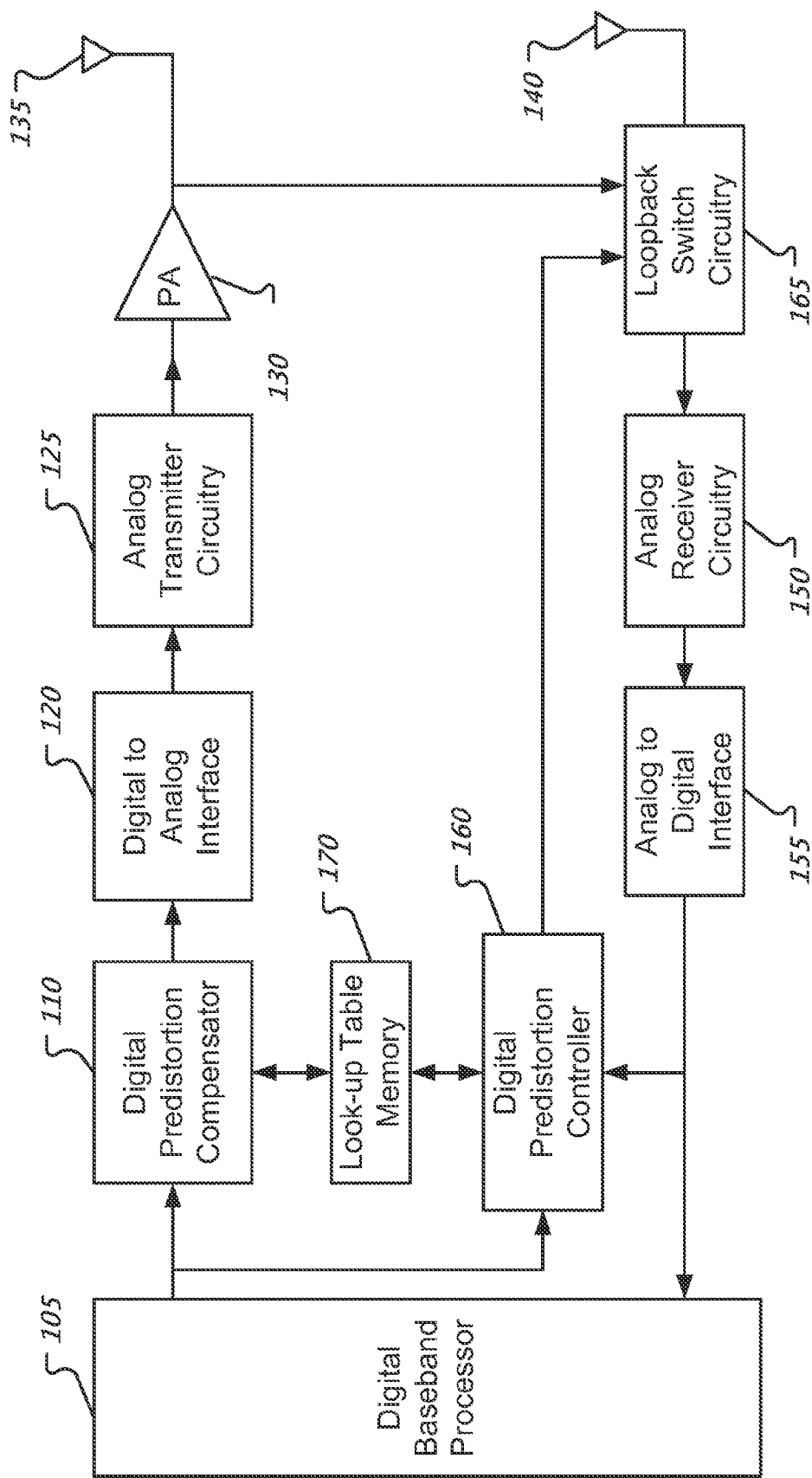
FIG. 1 shows an example of a wireless communication device architecture.

FIG. 1 shows an example of a wireless communication device architecture, which can include the various implementation details described above. A device can include a digital baseband processor 105, digital predistortion compensator 110, digital to analog interface 120, analog transmitter circuitry 125, power amplifier (PA) 130, transmit antenna 135, receive antenna 140, analog receiver circuitry 150, analog to digital interface 155, a digital predistortion controller 160, a look-up table memory 170, and a loopback switch circuitry 165. In some implementations, the digital baseband processor 105 includes the digital predistortion compensator 110, look-up table memory 170, and the digital predistortion controller 160.

The digital baseband processor 105 can generate data for transmission and output a digital signal. In some implementations, the digital baseband processor 105 can perform an Inverse Fast Fourier Transform (IFFT) to produce a signal based on orthogonal frequency division multiplexing (OFDM). In some implementations, the digital baseband processor 105 communicates with a host processor to receive data for transmission.

The digital to analog interface 120, e.g., a digital to analog converter (DAC), converts a digital signal into an analog signal. The analog transmitter circuitry 125 receives an analog signal from the digital to analog interface 120. The analog transmitter circuitry 125 can include modulation circuitry (not shown). In some implementations, the modulation circuitry is driven by an oscillator that is tuned to a carrier frequency, to up-convert a baseband analog signal. The power amplifier 130 amplifies a signal from the analog transmitter circuitry 125 and produces an amplified signal that is transmitted via the transmit antenna 135. In some implementations, analog transmitter circuitry 125 includes the power amplifier 130.

The analog receiver circuitry 150 can receive a signal via a receive antenna 140. The analog receiver circuitry 150 can include modulation circuitry, driven by an oscillator that is tuned to a carrier frequency, to down-convert a signal into a baseband analog signal. An analog to digital interface 155, e.g., an analog to digital converter (ADC), converts an analog signal from the analog receiver circuitry 150 into a digital signal. The digital baseband processor 105 can process a digital signal from the analog to digital interface 155. For example, the processor 105 can decode a received signal. The analog receiver circuitry 150 can receive an analog receive signal in one of multiple modes such as an operational mode and a predistortion training mode. In an operational mode, a device uses the analog receiver circuitry 150 to receive a signal from a different device. In a predistortion training mode, the device uses the analog receiver circuitry 150 to receive a signal transmitted by the device for determining predistortion values.

The digital predistortion compensator 110 is coupled between the digital baseband processor 105 and the digital to analog interface 120. If activated, the compensator 110 transforms a digital input signal such that the transformed signal counteracts one or more nonlinear characteristics of the power amplifier 130. The digital predistortion compensator 110 uses one or more predistortion values (e.g., gain predistortion values, phase predistortion values, or both) that are stored in a look-up table memory 170. The predistortion values are determined by the digital predistortion controller 160. In some implementations, a look-up table memory 170 can reside in a general purpose memory that stores data.

The digital predistortion controller 160 can compare a digital transmission signal with a received version of the signal to estimate predistortion values. The controller 160 can be configured to store signal samples, the signal samples including transmit samples based on the digital transmit signal and receive samples based on the digital receive signal, determine coefficients (e.g., gain coefficients, phase coefficients, or both) based on at least a portion of the signal samples, the coefficients being associated with respective first operational ranges of the power amplifier, and determine predistortion values based on the coefficients. For example, the predistortion values can include gain predistortion values based on gain coefficients, and one or more gain predistortion values based on an extrapolation of at least two of the gain coefficients, the later values being associated with respective second operational ranges of the power amplifier.

The digital predistortion controller 160 can include a signal synchronizer and a power normalizer. A signal synchronizer can synchronize a transmission signal with a received version of the transmission signal so that a comparison can be made. A power normalizer (e.g., power alignment) can adjust signal strengths (e.g., transmitted signals, received signals, or both) based on one or characteristics of the device.

The digital predistortion controller 160 can activate a loopback of a transmission signal by sending a loopback control signal to the loopback switch circuitry 165. Based on the control signal, the loopback switch circuitry 165 takes the transmission signal from the power amplifier 130 and feeds the signal into the analog receiver circuitry 150. In some implementations, the loopback switch circuitry 165 includes a variable attenuator (not shown). The variable attenuator can attenuate at least a portion of the amplification produced by the power amplifier 130. However, when the device is not required to be in a loopback, the variable attenuator can be set to no attenuation or can be bypassed. In some implementations, the analog receiver circuitry 150 includes loopback switch circuitry 165.

In some implementations, the digital predistortion controller 160 operates the compensator 110 to perform a default transformation during a training period. In some implementations, the digital predistortion controller 160 deactivates the transformation function of the compensator 110 during an initial portion of a training period. After initial digital predistortion values are estimated, the digital predistortion controller 160 can activate the transformation function of the compensator 110. Based on subsequent transmit and receive samples, the digital predistortion controller 160 can iteratively adjust the digital predistortion values until detected nonlinear characteristic, e.g., detected errors, are reduced below a threshold value, which can be a pre-determined value.

In some implementations, the transmit antenna 135 is integrated with the receive antenna 140. In some implementations, the transmit antenna 135 is separate from the receive antenna 140. In some implementations, the transmit antenna 135 is one of many transmit antennas. In some implementations, the transmit antenna 135 is one of many receive antennas.

In some implementations, the digital baseband processor 105 is configured to implement the functionality of the digital predistortion compensator 110 and the digital predistortion controller 160. In some implementations, the digital baseband processor 105 includes two or more processor cores. In some implementations, a device includes a system on a chip (SoC). For example, the SoC can include a host processor and a digital signal processor configured as the digital baseband processor 105.

Figure 2:
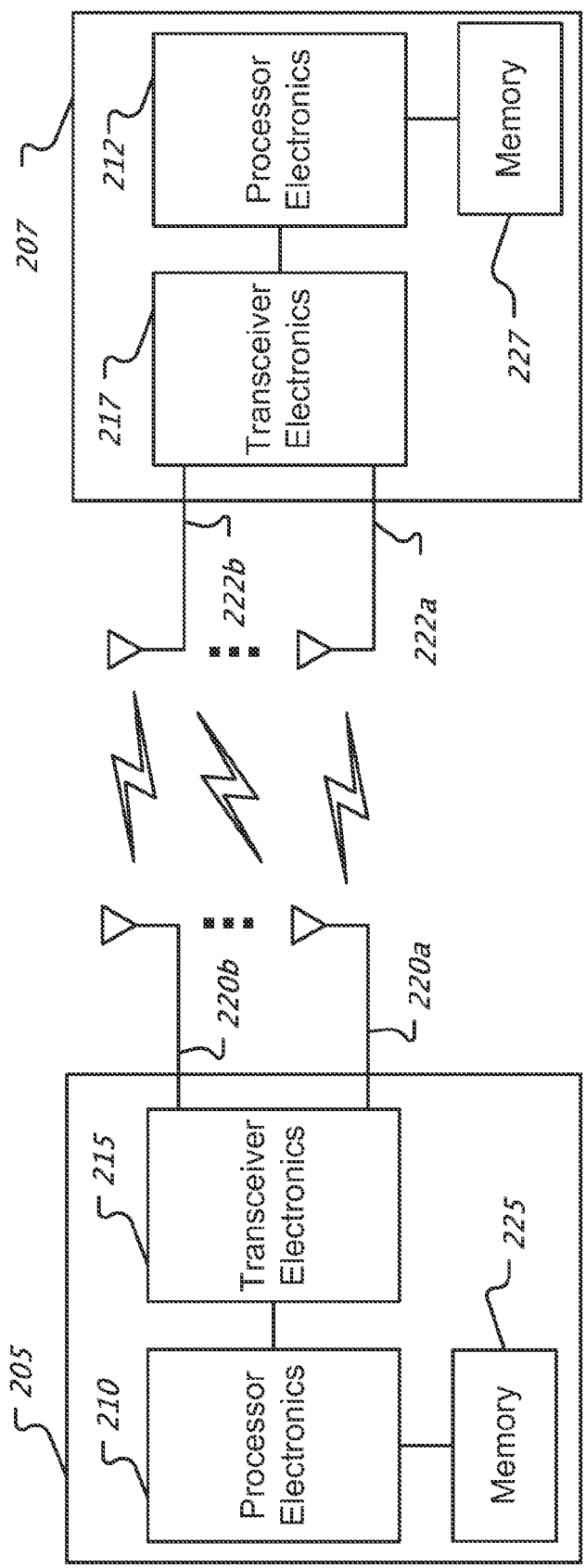
FIG. 2 shows an example of a wireless network with two wireless communication devices.

FIG. 2 shows an example of a wireless network with two wireless communication devices. Wireless communication devices 205, 207 such as an access point (AP), base station (BS), wireless headset, access terminal (AT), client station, or mobile station (MS) can include circuitry such as processor electronics 210, 212. Processor electronics 210, 212 can include one or more processors that implement one or more techniques presented in this disclosure. Wireless communication devices 205, 207 include circuitry such as transceiver electronics 215, 217 to send and receive wireless signals over one or more antennas 220a, 220b, 222a, 222b. In some implementations, transceiver electronics 215, 217 include integrated transmitting and receiving circuitry. Wireless communication devices 205, 207 include one or more memories 225, 227 configured to store information such as data, instructions, or both. In some implementations, wireless communication devices 205, 207 include dedicated circuitry for transmitting and dedicated circuitry for receiving.

Figure 3:
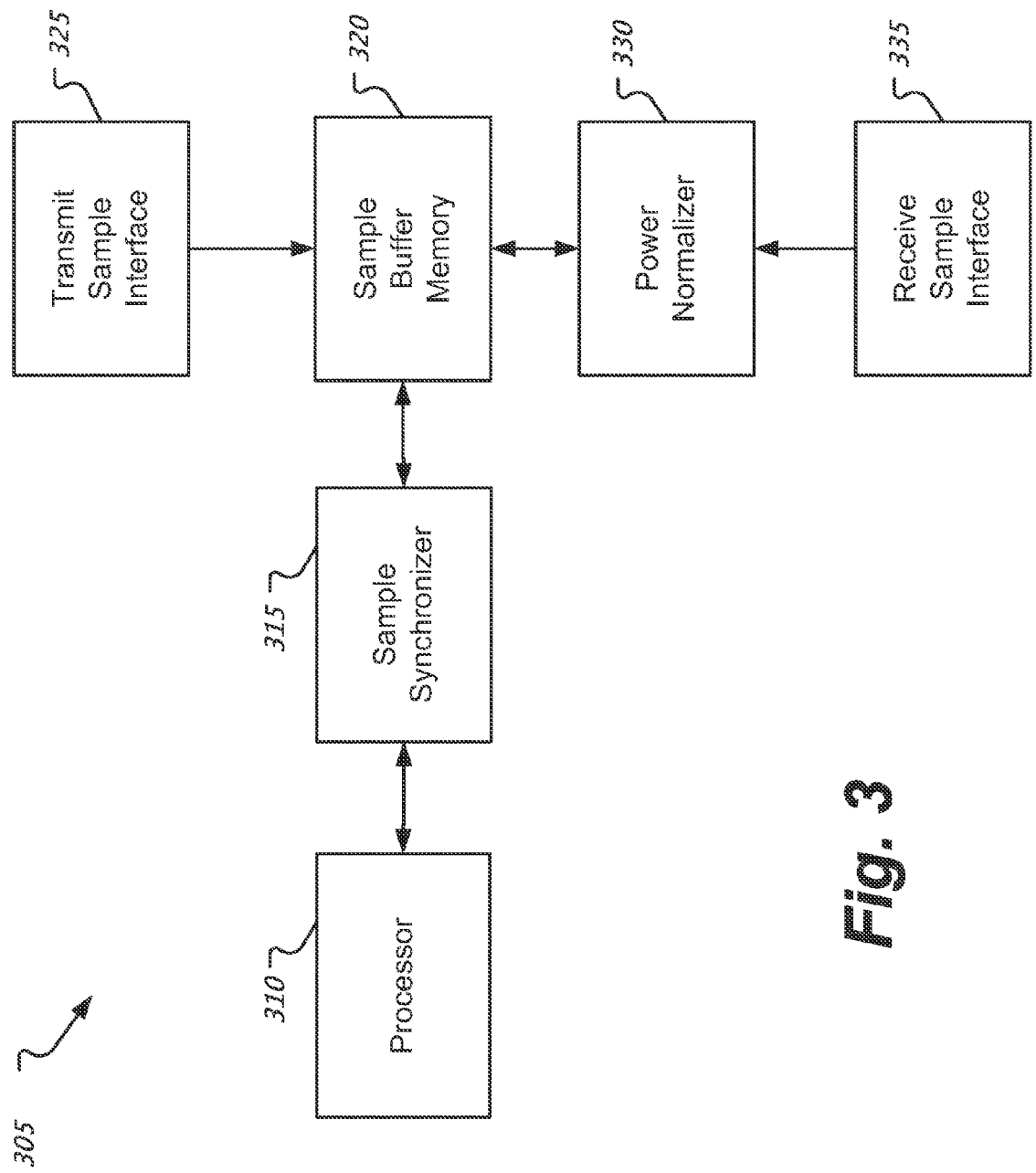
FIG. 3 shows an example of a digital predistortion estimation controller architecture.

FIG. 3 shows an example of a digital predistortion estimation controller architecture. A digital predistortion estimation controller 305 can include a processor 310, sample synchronizer 315, sample buffer memory 320, transmit sample interface 325, power normalizer 330, and receive sample interface 335. The transmit sample interface 325 produces samples of a digital transmit signal and stores them into the sample buffer memory 320. In some implementations, transmit sample interface 325 and a DAC receive the same signal. The receive sample interface 335 produces samples of a digital receive signal and stores them into the sample buffer memory 320. The receive sample interface 335 can sample a digital receive signal produced by an ADC.

If required, the power normalizer 330 can normalize receive samples with respect to transmit samples. The sample synchronizer 315 can align transmit samples with receive samples. The processor 310 can determine predistortion values based on aligned transmit and receive samples. In some implementations, the processor 310 includes the sample synchronizer 315 and the sample buffer memory 320.

Figure 4:
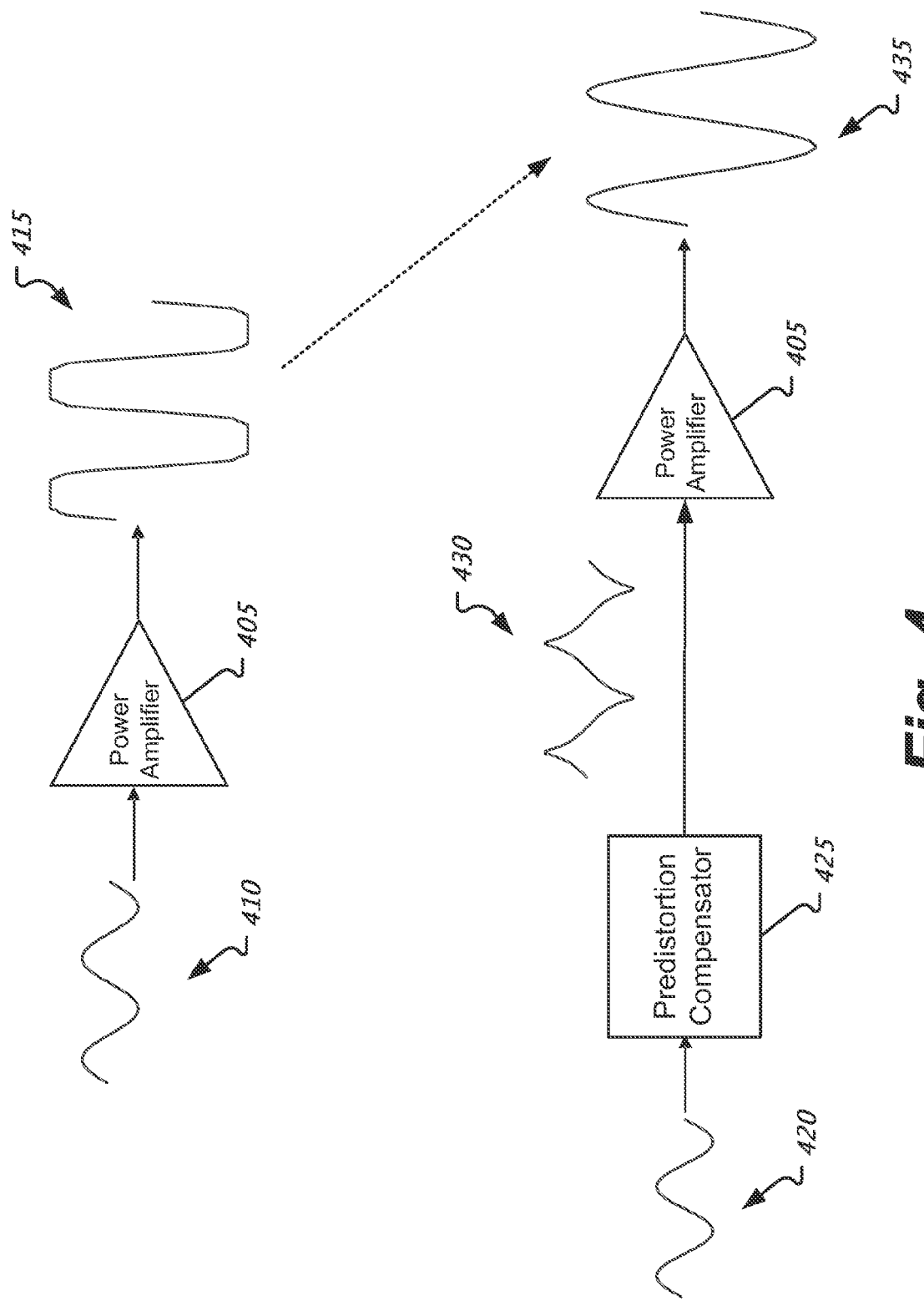
FIG. 4 shows an example of predistortion.

FIG. 4 shows an example of predistortion. A power amplifier 405, having one or more nonlinear characteristics distorts a signal 410 in producing an amplified signal 415. The distorted amplified signal 415, as shown, is clipped at higher amplitudes. However, a predistortion compensator 425 predistorts a signal 420 to produce a predistorted signal 430. The power amplifier 405 amplifies the predistorted signal 430 to produce an amplified signal 435. As shown, the amplified signal 435 that is based on predistortion is not clipped.

Figure 5:
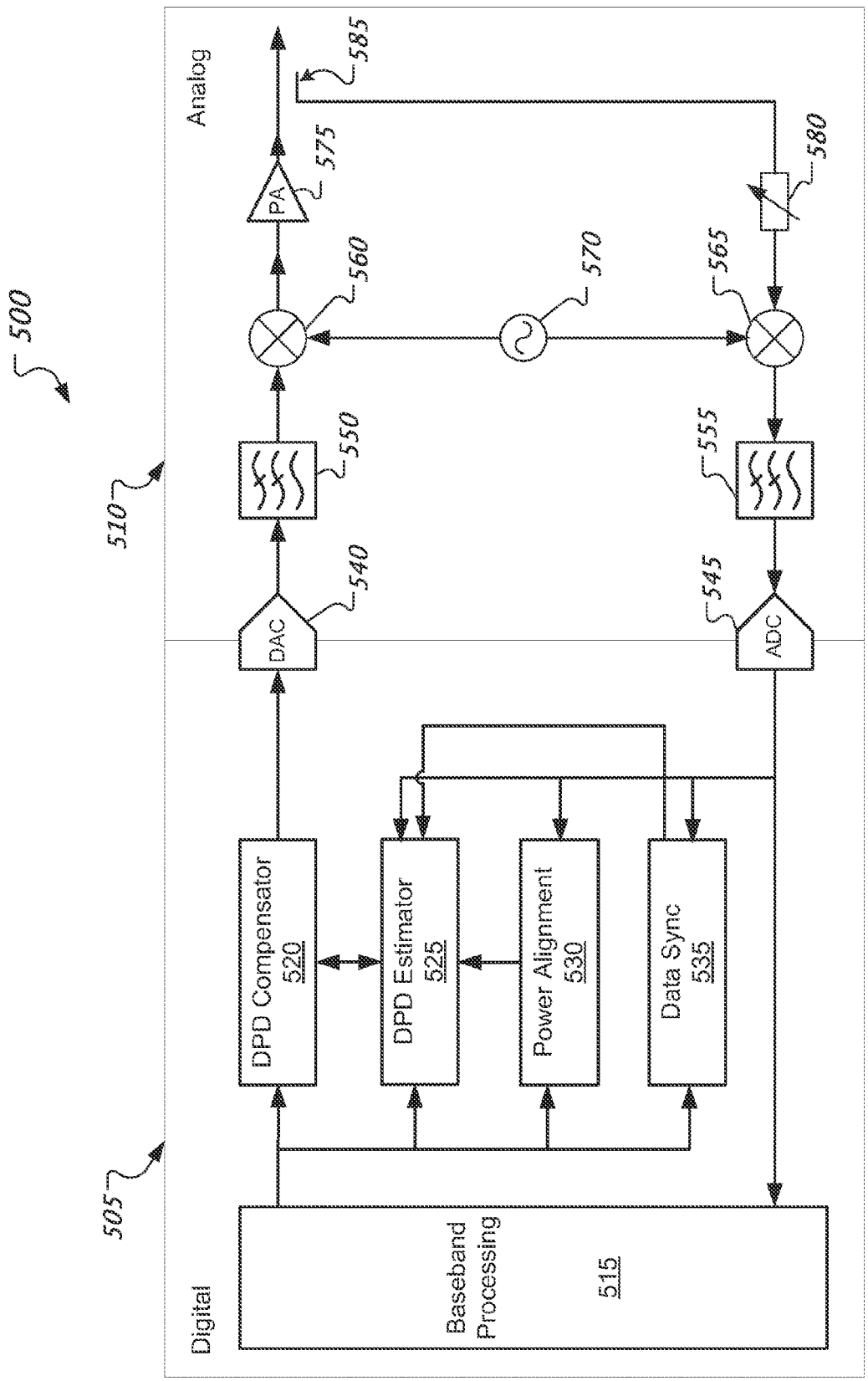
FIG. 5 shows an example of a device that implements digital predistortion.

FIG. 5 shows an example of a device that implements digital predistortion. The device 500 includes digital circuitry 505 such as one or more processors, e.g., digital signal processor or a processor configured to perform signal processing. The device 500 includes a baseband processing module 515 to generate transmission signals and process received signals. The device 500 includes analog circuitry 510, which includes a transmit filter 550, receive filter 555, mixers 560, 565 for signal modulation, oscillator 570, power amplifier 575, attenuator 580 such as a variable attenuator, and a radio frequency (RF) coupler 585. The device 500 includes a DAC 540 and an ADC 545 to interface signals between digital circuitry 505 and analog circuitry 510. The device 500 performs digital predistortion estimation and compensation using a digital predistortion (DPD) compensator 520, digital predistortion (DPD) estimator 525, power alignment module 530, and a data sync module 535. The digital predistortion compensator 520 provides a predistorted digital transmit signal to the DAC 540 based on a transmit signal generated by the baseband processing module 515.

The device 500 can perform digital predistortion estimation and compensation in the digital domain using transmitted and received signals as input. In some implementations, a digital predistortion technique does not require prior knowledge of (e.g., is agnostic to) one or more signal characteristics such as modulation type, baseband frequency, and intermediate frequency. A digital predistortion technique can be incorporated with a power control mechanism such as an adaptive power control mechanism. Based on a size of the change in power, the device 500) can trigger digital predistortion training.

The device 500 can include an attenuator 580 to eliminate or reduce receiver saturation when a transmission signal is looped back through the receiver circuitry via a RF coupler 585. In some implementations, the bandwidth of the transmit filter 550 is at least two times that of a signal bandwidth to allow passage of predistorted signals. For example, transmit filter 550 bandwidth should be large enough to accommodate the predistorted signal spectrum. In some implementations, a bandwidth of the receive filter 555 is at least wide enough to pass through signals distorted by one or more nonlinear characteristics of the power amplifier 575. For example, the bandwidth of the receive filter 555 is at least two times that of a signal bandwidth to allow passage of predistorted signals. In a predistortion training mode, the receive filter 555 can be reconfigured to have wider bandwidth or to be bypassed.

The baseband processing module 515 provides transmit samples to the digital predistortion compensator 520, digital predistortion estimator 525, power alignment module 530, and data sync module 535. The ADC 545 can provide receive samples to the digital predistortion estimator 525, power alignment module 530, and data sync module 535. The digital predistortion estimator 525 can determine predistortion values and provide the predistortion values to the digital predistortion compensator 520.

The device 500 can perform synchronization between the transmitted and received signals for the estimation of predistortion values via the data sync module 535. For example, a data sync module 535 can determine a sync parameter value r for aligning entries in a transmit signal vector with entries in a receive signal vector. The data sync module 535 can provide a sync parameter value to the digital predistortion estimator 525.

The device 500 can align the power of received signals with the transmitted signals for the estimation of predistortion values via the power alignment module 530. The power alignment module 530 normalizes the power of a received signal to that of a transmitted signal. In some implementations, the power alignment module 530 provides power normalization information to the digital predistortion estimator 525. In some implementations, transmit power control is required to be performed before digital predistortion compensation. Digital predistortion can increase the peak-to-average power ratio of an input signal. The device 500 can perform a digital back-off of the original input signal.

The nonlinearity produced by the power amplifier 575 can be significantly greater than any nonlinearity caused within the receiver circuitry such as the attenuator 580, mixer 565, or receive filter 555. In some implementations, a device 500 includes an automatic gain controller (AGC) to minimize or eliminated a nonlinear contribution from the receiver circuitry, FIGS. 6A and 6B show examples of nonlinear characteristics of a power amplifier. A highly nonlinear power amplifier, which significantly degrades transmit signal quality and spectrum, adds nonlinearity to the amplitude and phase of signals. Nonlinear characteristics can include one or more nonlinear gain characteristics and one or more nonlinear phase characteristics.

In FIG. 6A, a graph 605 depicts a divergence in gain between an ideal power amplifier and an actual power amplifier. The ideal power amplifier amplifies input signals over all of the input voltage values ($V_{in}$ values) and produces corresponding output voltage values ($V_{out}$ values) in a linear fashion. The input voltages can be grouped into different operational ranges of a power amplifier (e.g., 0V to 0.1V, 0.11V to 0.2V, 0.21V to 0.3V, etc.). However, the actual power amplifier deviates from the performance of the ideal power amplifier. In this example, the P1 dB marker on graph 605 denotes a $V_{in}$ value corresponding to a 1 dB deviation.

In FIG. 6B, a graph 610 depicts nonlinear phase delays in the output of the actual power amplifier. The phase delay in the output signal is represented in degrees relative to the input signal. As shown, different input voltages causes different phase delays.

Figure 7:
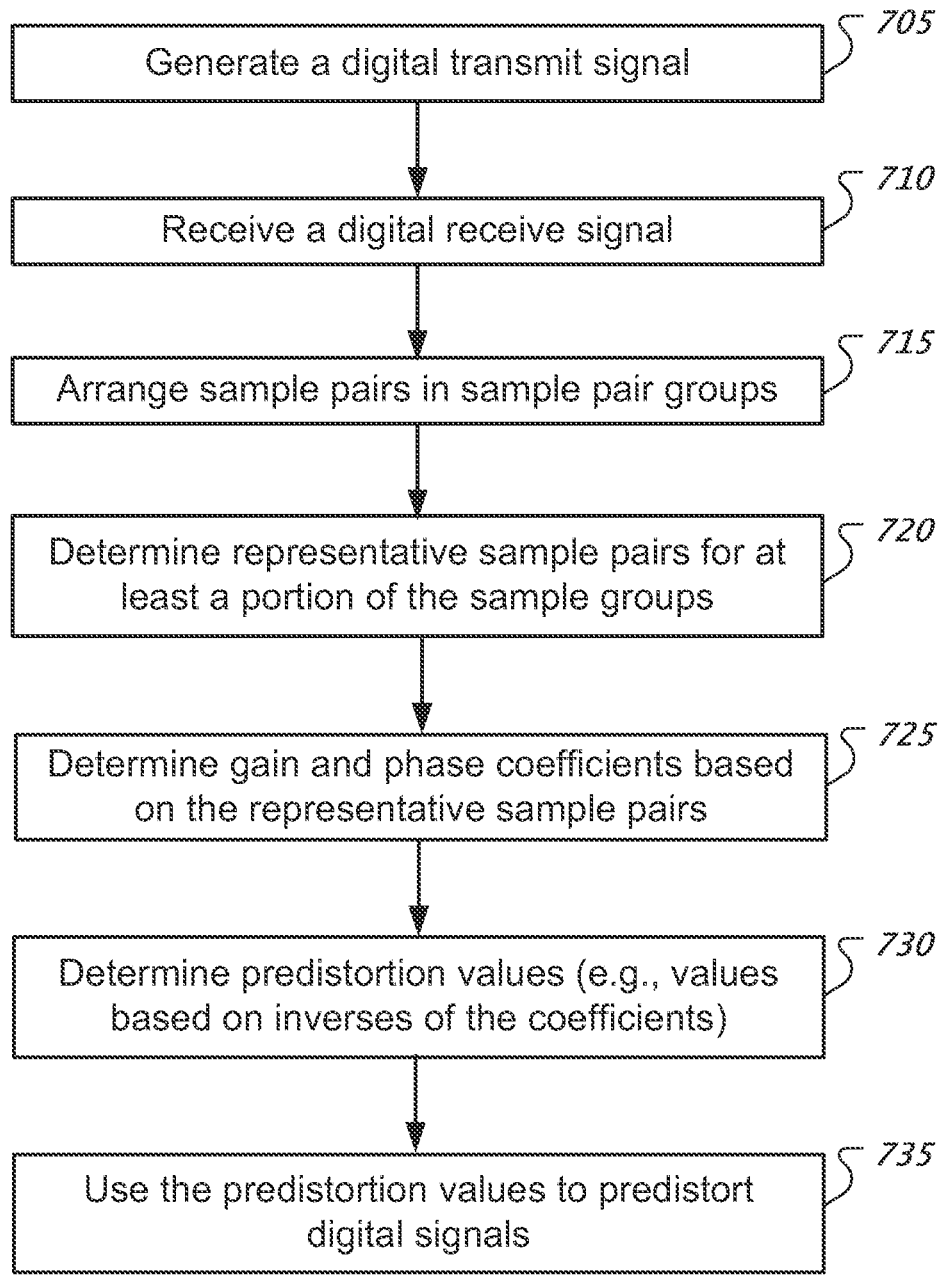
FIG. 7 shows an example of a communication process that includes digital, predistortion estimation and compensation.

FIG. 7 shows an example of a communication process that includes digital predistortion estimation and compensation. At 705, the communication process generates a digital transmit signal. The digital transmit signal can be represented by a sequence of transmit samples. At 710, the process receives a digital receive signal. In this example, the digital receive signal is based on an amplified analog version of the digital transmit signal. The amplified analog version is produced by a power amplifier having one or more nonlinear characteristics.

At 715, the process arranges sample pairs in sample pair groups. A sample pair includes a transmit sample based on the digital transmit signal and a receive sample based on the digital receive signal. The process aligns receive samples with corresponding transmit samples to form sample pairs (e.g., the receive sample of a sample pair corresponds to the transmit sample of the sample pair). Aligning receive samples can include adjusting a receive sample array index offset to correspond to a transmit sample array index. In some implementations, a sample pair includes an array index to a transmit sample array and an array index to an aligned receive sample array. In some implementations, a sample pair refers to a transmit sample value in a first array and an aligned receive sample value in a second array.

Arranging sample pairs in sample pair groups, at 715, can include selecting transmit samples of the digital transmit signal that meet or exceed a threshold parameter (e.g., a voltage threshold parameter) based on the digital transmit signal. The threshold parameter can be selected based on a noise floor. In some implementations, the threshold parameter is based on 1 dB divergence between the ideal power amplifier and the actual power amplifier (e.g., see the P1 dB marker depicted by FIG. 6A). Arranging signal pairs can include ordering the selected transmit samples, where the sample pair groups include different ordered portions of the transmit sample. The sample pair groups can be associated with respective segments (e.g., operational ranges) of input voltages.

At 720, the process determines representative sample pairs for at least a portion of the sample pair groups. Determining the representative sample pairs can include determining a representative receive sample of a sample pair group based on an average of digital receive samples included in the sample pair group. Determining the representative sample pairs can include determining a representative transmit sample. In some implementations, the representative transmit sample is a predetermined value that is associated with an operational range of the power amplifier. Other techniques for determining representative samples are possible.

At 725, the process determines gain and phase coefficients based on the representative sample pairs. The gain coefficients are associated with respective operational ranges of the power amplifier. The operational ranges can be associated with respective voltage values. Similarly, the phase coefficients are associated with the operational ranges, respectively. For example, in some power amplifiers, higher amplitudes (e.g., higher voltage values) cause greater divergences from the ideal amplifier. Thus, different amplitude values may require different gain coefficients for predistortion.

At 730, the process determines predistortion values. In some case, the process determines one or more predistortion values based on inverses of the coefficients. The predistortion values can include values based on multiplicative inverses of the gain coefficients. The predistortion values can include values based on additive inverses of the phase coefficients. The process can include storing the predistortion values in a data structure (e.g., a look-up table or an array) that is indexed by values such as amplitude values or reference values.

Determining predistortion values, at 730, can include computing first values based on multiplicative inverses of the gain coefficients, the first values being associated with first operational ranges of the power amplifier. Determining predistortion values, at 730, can include computing one or more second values based on an extrapolation of at least a portion of the gain coefficients, the one or more second values being associated with one or more second operational ranges of the power amplifier. The communication process can include performing the extrapolation with respect to a threshold parameter, where the first operational ranges meet or surpass the threshold parameter, and the one or more second operational ranges do not surpass the threshold parameter.

At 735, the process uses the predistortion values to predistort digital signals. Using the predistortion values to predistort digital signals can compensate for the one or more nonlinear characteristics of the power amplifier. For example, a signal passing through a predistortion compensator followed by a power amplifier yields minimal or no distortion, because the predistortion compensator and the non-linear behavior of the power amplifier effectively cancel each other. Using the predistortion values can include accessing a sample value of a digital signal, retrieving a predistortion value from the data structure based on the accessed sample value, and applying the retrieved predistortion value to the accessed sample value. Applying the retrieved predistortion value can include multiplying the retrieved predistortion value and the accessed sample value.

In some implementations, arranging, at 715, sample pairs in sample pair groups can include aligning samples. Aligning samples can include determining a synchronization offset value to align transmit samples with receive samples. Determining a synchronization offset value can include the matching of a known transmit pattern to at least a portion of the received data. In some implementations, determining a synchronization offset value includes performing a correlation operation based on at least a portion of the transmit samples and the receive samples. Aligning samples can include determining one or more power normalization parameter values to normalize a power of the digital receive signal with respect to the digital transmit signal. Such normalization can cause the received signal to have the same power as the transmit signal. The communication process can use the synchronization offset value to offset a sample index value to match a transmit sample with a corresponding receive sample. The communication process can use the normalization parameter values to adjust a power of the digital receive signal. In some implementations, the communication process can cause receiver circuitry to use the normalization parameter values to adjust a power before conversion into a digital receive signal.

Determining predistortion values, at 730, can include determining one or more predistortion values for one or more operational ranges that are less than a threshold parameter. Determining the predistortion values can include determining one or more predistortion values for one or more operational ranges that meet or exceed the threshold parameter. Determining the predistortion values can include determining one or more values for one or more operational ranges that are less than the threshold parameter. Predistortion values for operational ranges that are less than the threshold parameter can be based on an extrapolation of at least a portion the coefficients determined at 725.

In some implementations, a communication process includes controlling, in a predistortion training mode, an attenuator to attenuate the amplified analog version to avoid saturating receiver circuitry. In some implementations, the process includes sending a signal to control loopback circuitry to loop a transmit signal back into receiver circuitry. In some implementations, a processor collects signal samples including values sent to a DAC in a transmission path and values received from an ADC in a receive path. Signal samples, such as transmit samples and receive samples, can be complex numbers.

Figure 8:
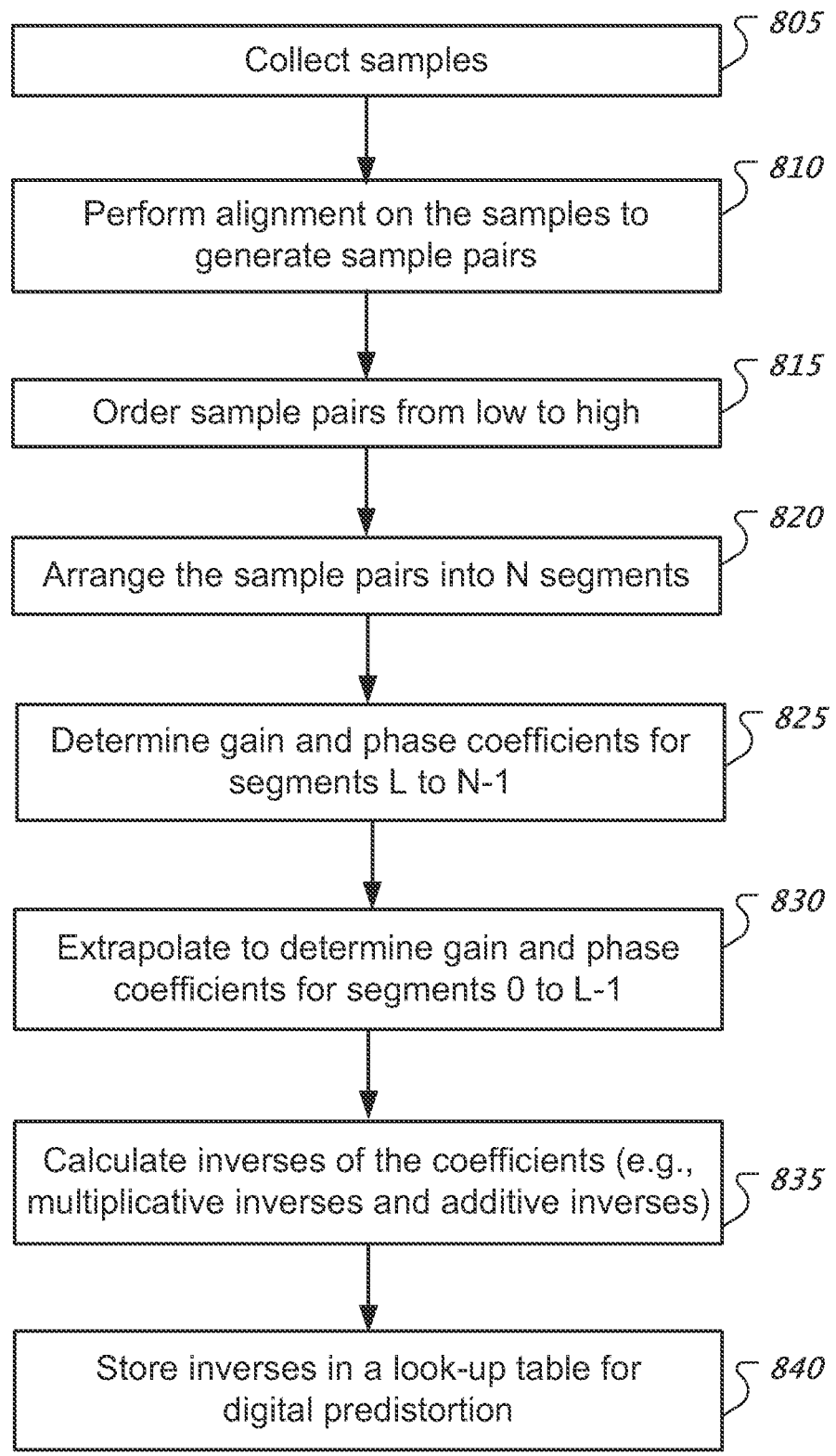
FIG. 8 shows another example of a communication process that includes digital predistortion estimation and compensation.

FIG. 8 shows another example of a communication process that includes digital predistortion estimation and compensation. At 805, the communication process collects samples. For example, a baseband processor can collect samples from a digital transmit signal and a digital receive signal. In a predistortion training mode, the process causes the digital receive signal to be based on the digital transmit signal via a loopback pathway. At 810, the communication process performs an alignment on the samples to generate sample pairs. Performing the alignment can include performing receiver data synchronization on a received signal y(t) to produce an aligned received signal y'(t) (e.g., y'(t)=y(t+τ)). After receiver data synchronization, an aligned received signal can be represented as a function of a transmitted signal: y'(t)=g(x(t)), where x(t), y'(t), and g(t) denotes transmitted signal, aligned received signal, and power amplifier nonlinear function respectively. A sample pair includes a digital transmit sample value (e.g., $x(t_1)$) and an aligned digital receive sample value (e.g., $y'(t_1)$).

At 815, the communication process orders sample pairs from low to high. Sample pairs can be ordered from low to high based on the digital transmit sample value of a sample pair.

At 820, the communication process arranges the sample pairs into N segments. Digital transmit samples having the same values are grouped into the same segment. In some implementations, samples that have about the same values are grouped into the same segment. For example, values that are within a predetermined range of a predetermined voltage point are grouped into the same segment. Let $\hat{x}_n$ represent the representative digital transmit sample value of the n-th segment. In some implementations, the representative digital transmit sample value is an average of digital transmit sample values included in the corresponding segment. Let $\hat{y}'_n$ represent the representative digital receive sample value of the n-th segment. In some implementations, the representative digital receive sample value is an average value of digital receive sample values included in the corresponding segment.

At 825, the communication process determines gain and phase coefficients for segments L to N−1. Determining coefficients can include calculating representative sample values. A representative digital receive sample value can be expressed as $\hat{y}'_n = |\hat{y}'_n| e^{j\phi(\hat{y}'_n)}$ where $\phi$ represents a phase function. The representative digital receive sample value can also be expressed as $$\hat{y}'_n = g(\hat{x}_n) = \alpha_n |\hat{x}_n| e^{j[\phi(\hat{x}_n) + \beta_n]}$$

where $\alpha_n$ is the gain coefficient for the n-th segment and $\beta_n$ is a phase coefficient for the n-th segment. Gain coefficients are calculated based on $\alpha_n = |\hat{y}'_n|/|\hat{x}_n|$ for $n \in [L, N-1]$. Phase coefficients are calculated based on $\beta_n = \phi(\hat{y}'_n) - \phi(\hat{x}_n)$ for $n \in [L, N-1]$. In some implementations, phase coefficients are calculated based on $\beta_n = \phi(\hat{y}'_n \cdot \hat{x}_n^*)$. In some implementations, coefficients are calculated for all segments.

At 830, the communication process extrapolates to determine gain and phase coefficients for segments 0 to L−1. Extrapolating gain coefficients can include fitting a line to gain coefficients and voltage values for $n \in [L, N-1]$. The process can compute gain coefficients for $n \in [0, L-1]$ based on the fitted line. Extrapolating phase coefficients can include fitting a line to phase coefficients and voltage values for $n \in [L, N-1]$. The process can compute phase coefficients for $n \in [0, L-1]$ based on the fitted line. Other fitting techniques are possible.

At 835, the communication process calculates inverses of the coefficients. Calculating the inverses can include calculating multiplicative inverses of the gain coefficients (e.g., $a_n = (\alpha_n)^{-1}$). Calculating the inverses can include calculating additive inverses of the phase coefficients (e.g., $b_n = -\beta_n$).

At 840, the communication process stores inverses in a look-up table for digital predistortion. A look-up table can include N entries, each entry having $a_n$ value and a $b_n$ value. In some implementations, entries are accessed based on a quantization of an input voltage. For example, one or more less significant bits of a digital transmit signal value (e.g., a voltage value for a discrete time index in a transmit signal) can be ignored or rounded off before accessing the table.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination, of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A method, comprising:
   aligning a received data sequence with a transmitted data sequence to produce an aligned data sequence, wherein the received data sequence is based on an output of a power amplifier having one or more nonlinear characteristics that is responsive to the transmitted data sequence;
   dividing the aligned data sequence into N segments;
   obtaining first nonlinear parameters for the power amplifier based at least on first segments of the N segments;
   obtaining one or more second nonlinear parameters corresponding to one or more second segments of the N segments based at least on an extrapolation of the first nonlinear parameters, wherein the one or more second segments have lower transmitted data sequence values than the first segments; and
   performing digital predistortion on a transmit data sequence based at least on predistortion parameters to compensate for the one or more nonlinear characteristics of the power amplifier, the predistortion parameters comprising the first nonlinear parameters and the one or more second nonlinear parameters.

2. The method of claim 1, wherein obtaining the first nonlinear parameters comprises determining first gain coefficients corresponding respectively to the first segments, and wherein obtaining the one or more second nonlinear parameters comprises determining one or more second gain coefficients based on an extrapolation of at least two of the first gain coefficients.

3. The method of claim 1, wherein obtaining the first nonlinear parameters comprises determining first phase coefficients corresponding respectively to the first segments, and wherein obtaining the one or more second nonlinear parameters comprises determining one or more second phase coefficients based on an extrapolation of at least two of the first phase coefficients.

4. The method of claim 1, wherein performing digital predistortion comprises:
   accessing a sample value of the transmit data sequence;
   retrieving a predistortion parameter from a data structure based on the accessed sample value, the data structure storing the predistortion parameters indexed based on input amplitude ranges or values; and
   applying the retrieved predistortion parameter to the accessed sample value.

5. The method of claim 1, wherein the first segments and the one or more second segments are separated by a threshold parameter that is selected to avoid noisy estimation.

6. The method of claim 1, wherein the aligning comprises arranging sample pairs in sample pair groups, each sample pair comprising a transmit sample of the transmitted data sequence and a receive sample of the received data sequence, wherein the receive samples of the sample pairs are aligned with the corresponding transmit samples of the sample pairs.

7. The method of claim 6, comprising:
   determining representative sample pairs for at least a portion of the sample pair groups that correspond to the first segments, wherein obtaining first nonlinear parameters comprises determining gain coefficients, corresponding respectively to the first segments, that are based on the representative sample pairs.

8. An apparatus, comprising:
   circuitry configured to align a received data sequence with a transmitted data sequence to produce an aligned data sequence, and to divide the aligned data sequence into N segments, wherein the received data sequence is based on an output of a power amplifier having one or more nonlinear characteristics that is responsive to the transmitted data sequence; and
   an estimator configured to obtain first nonlinear parameters for the power amplifier based at least on first segments of the N segments, and to obtain one or more second nonlinear parameters corresponding to one or more second segments of the N segments based at least on an extrapolation of the first nonlinear parameters, wherein the one or more second segments have lower transmitted data sequence values than the first segments.

9. The apparatus of claim 8, wherein the first nonlinear parameters comprise first gain coefficients corresponding respectively to the first segments, and wherein the one or more second nonlinear parameters comprise one or more second gain coefficients based on an extrapolation of at least two of the first gain coefficients.

10. The apparatus of claim 8, wherein the first nonlinear parameters comprise first phase coefficients corresponding respectively to the first segments, and wherein the one or more second nonlinear parameters comprise one or more second phase coefficients based on an extrapolation of at least two of the first phase coefficients.

11. The apparatus of claim 8, comprising:
   a compensator configured to perform digital predistortion on a transmit data sequence based at least on predistortion parameters to compensate for the one or more nonlinear characteristics of the power amplifier, the predistortion parameters comprising the first nonlinear parameters and the one or more second nonlinear parameters.

12. The apparatus of claim 11, wherein the compensator is configured to:
   access a sample value of the transmit data sequence,
   retrieve a predistortion parameter from a data structure based on the accessed sample value, the data structure storing the predistortion parameters indexed based on input amplitude ranges or values, and
   apply the retrieved predistortion parameter to the accessed sample value.

13. The apparatus of claim 8, wherein the first segments and the one or more second segments are separated by a threshold parameter that is selected to avoid noisy estimation.

14. The apparatus of claim 8, wherein the circuitry comprises a data sync module that is configured to arrange sample pairs in sample pair groups, each sample pair comprising a transmit sample of the transmitted data sequence and a receive sample of the received data sequence, and wherein the receive samples of the sample pairs are aligned with the corresponding transmit samples of the sample pairs.

15. The apparatus of claim 14, wherein the circuitry is configured to determine representative sample pairs for at least a portion of the sample pair groups that correspond to the first segments, and wherein the first nonlinear parameters comprises gain coefficients, corresponding respectively to the first segments, that are based on the representative sample pairs.

16. A system, comprising:
   processor electronics configured to produce a digital transmit data sequence;
   a first converter to convert the digital transmit data sequence to an analog transmit signal;
   a power amplifier configured to produce an amplified signal based on the analog transmit signal, wherein the power amplifier has one or more nonlinear characteristics;
   a second converter to convert the amplified signal to a digital receive data sequence;
   circuitry configured to align the digital receive data sequence with the digital transmit data sequence to produce an aligned data sequence, and to divide the aligned data sequence into multiple segments; and
   an estimator configured to obtain first nonlinear parameters for the power amplifier based at least on first segments of the multiple segments, and to obtain one or more second nonlinear parameters corresponding to one or more second segments of the multiple segments based at least on an extrapolation of the first nonlinear parameters, wherein the one or more second segments have lower digital transmit data sequence values than the first segments,
   wherein the processor electronics are configured to perform digital predistortion based at least on predistortion parameters to compensate for the one or more nonlinear characteristics of the power amplifier, the predistortion parameters comprising the first nonlinear parameters and the one or more second nonlinear parameters.

17. The system of claim 16, wherein the first nonlinear parameters comprise first gain coefficients corresponding respectively to the first segments, and wherein the one or more second nonlinear parameters comprise one or more second gain coefficients based on an extrapolation of at least two of the first gain coefficients.

18. The system of claim 16, wherein the first nonlinear parameters comprise first phase coefficients corresponding respectively to the first segments, and wherein the one or more second nonlinear parameters comprise one or more second phase coefficients based on an extrapolation of at least two of the first phase coefficients.

19. The system of claim 16, wherein the processor electronics are configured to:
   access a sample value of an input data sequence,
   retrieve a predistortion parameter from a data structure based on the accessed sample value, the data structure storing the predistortion parameters indexed based on input amplitude ranges or values, and
   apply the retrieved predistortion parameter to the accessed sample value.

20. The system of claim 16, wherein the first segments and the one or more second segments are separated by a threshold parameter that is selected to avoid noisy estimation.

21. The system of claim 16, wherein the circuitry comprises a data sync module that is configured to arrange sample pairs in sample pair groups, each sample pair comprising a transmit sample of the digital transmit data sequence and a receive sample of the digital receive data sequence, and wherein the receive samples of the sample pairs are aligned with the corresponding transmit samples of the sample pairs.

22. The system of claim 21, wherein the circuitry is configured to determine representative sample pairs for at least a portion of the sample pair groups that correspond to the first segments, and wherein the first nonlinear parameters comprises gain coefficients, corresponding respectively to the first segments, that are based on the representative sample pairs.

23. The system of claim 16, wherein the processor electronics comprise the estimator.

24. The system of claim 16, wherein the processor electronics comprise the circuitry.

* * * * *